(12) United States Patent
Qian et al.

(10) Patent No.: US 12,382,740 B2
(45) Date of Patent: Aug. 5, 2025

(54) IMAGE SENSOR FOR INFRARED SENSING AND FABRICATION THEREOF

(71) Applicant: OmniVision Technologies, Inc., Santa Clara, CA (US)

(72) Inventors: Yin Qian, Milpitas, CA (US); Chen-Wei Lu, San Jose, CA (US); Jin Li, Fremont, CA (US); Shao-Fan Kao, San Jose, CA (US); Tung-Ti Yeh, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 428 days.

(21) Appl. No.: 18/050,402

(22) Filed: Oct. 27, 2022

(65) Prior Publication Data

US 2023/0215887 A1 Jul. 6, 2023

Related U.S. Application Data

(60) Provisional application No. 63/294,999, filed on Dec. 30, 2021.

(51) Int. Cl.
*H10F 39/00* (2025.01)
*H10F 39/18* (2025.01)

(52) U.S. Cl.
CPC ....... *H10F 39/8053* (2025.01); *H10F 39/024* (2025.01); *H10F 39/182* (2025.01); *H10F 39/184* (2025.01); *H10F 39/8063* (2025.01); *H10F 39/807* (2025.01)

(58) Field of Classification Search
CPC .. H10F 39/8053; H10F 39/807; H10F 39/182; H10F 39/8063; H10F 39/184; H10F 39/024

See application file for complete search history.

(56) References Cited

U.S. PATENT DOCUMENTS

| | | | |
|---|---|---|---|
| 9,484,377 B2 | 11/2016 | Won et al. | |
| 10,249,689 B2 * | 4/2019 | Kim | G02B 5/3041 |
| 10,677,968 B2 * | 6/2020 | Kim | G02B 5/201 |
| 10,714,530 B2 | 7/2020 | Hsieh et al. | |
| 11,069,730 B2 | 7/2021 | Nakajiki et al. | |
| 11,309,360 B2 * | 4/2022 | Joo | H10K 50/115 |

(Continued)

FOREIGN PATENT DOCUMENTS

JP 2016076682 5/2016

*Primary Examiner* — Mark W Tornow

(57) ABSTRACT

The invention disclose a pixel in an image sensor capable of detecting infrared light and associated fabrication method. The image sensor includes a semiconductor substrate having a first photodiode and a second photodiode adjacent to the first photodiode. A planarized dielectric layer having a recessed region is disposed on a first side of the semiconductor substrate. A first color filter is disposed on the planarized dielectric layer aligned with the first photodiode and configured to transmit light of a first wavelength range. A second color filter is disposed in the recessed region and on the planarized dielectric layer. The second color filter is aligned with the second photodiode, and configured to transmit light of a second wavelength range that is different from the first wavelength range. A first depth-wise thickness of the first color filter is less than a second depth-wise thickness of the second color filter.

14 Claims, 11 Drawing Sheets

(56) References Cited

U.S. PATENT DOCUMENTS

| | | |
|---|---|---|
| 2008/0150059 A1* | 6/2008 | Yun .................... H10F 39/8053 |
| | | 257/E31.127 |
| 2008/0283728 A1 | 11/2008 | Inoue |
| 2009/0168181 A1 | 7/2009 | Su et al. |
| 2014/0253767 A1* | 9/2014 | Kato .................... H04N 25/134 |
| | | 257/432 |
| 2016/0099280 A1 | 4/2016 | Huang et al. |
| 2018/0006137 A1* | 1/2018 | Lim .................. H10D 30/0316 |
| 2019/0273122 A1* | 9/2019 | Iwasaki ................ H10K 50/841 |
| 2022/0010121 A1 | 1/2022 | Kato |

* cited by examiner

IMAGE SENSOR FOR INFRARED SENSING AND FABRICATION THEREOF

RELATED APPLICATIONS

This application claims priority to U.S. Provisional Patent Application No. 63/294,999 filed Dec. 30, 2021, the entire content of which is incorporated herein by reference.

TECHNICAL FIELD

This disclosure relates to an image sensor and more particularly but not exclusively relates to RGB-IR type image sensors with improved infrared sensitivity.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
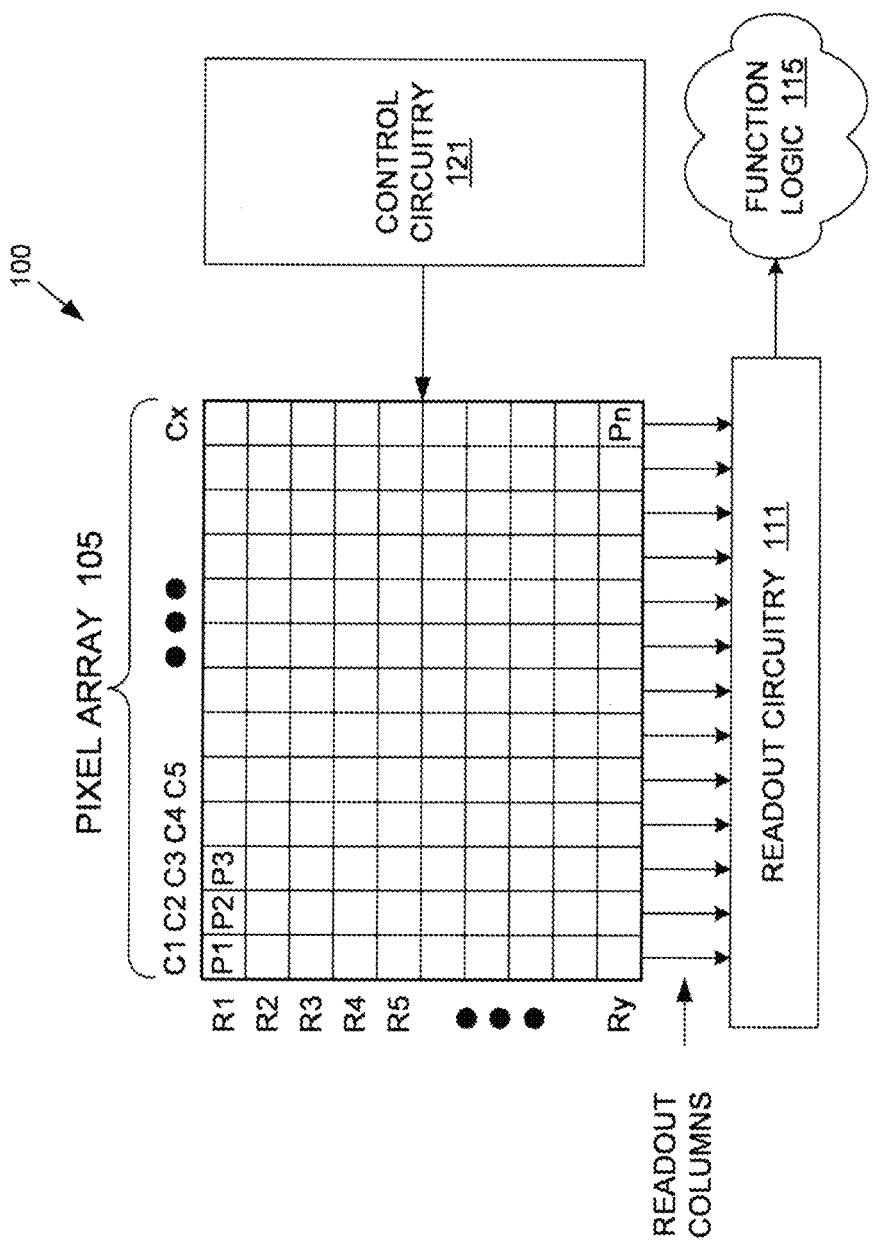
FIG. 1 illustrates an example block diagram of an imaging system including a pixel layout with photodiode region partially surrounding circuitry, in accordance with the teachings of the present disclosure.

The term "first", "second" or the like used herein may modify various elements regardless of order and/or priority, but does not limit the elements. Such terms may be used to distinguish one element from another element. For example, "a first user device" and "a second user device" may indicate different user devices regardless of order or priority. For example, without departing the scope of the present disclosure, a first element may be referred to as a second element and vice versa.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another elements, components, region, layer or section. Thus, a first element, component, region, layer or section discussed below could be termed a second element, component, region, layer or section without departing from the teachings of the inventive concept.

It should be understood that the use of these wavelength bands in present disclosure is not meant to limit the range of wavelength that an image sensor may sense, and are only used as examples. Additionally, in the following description, the term color is used to depict a select band of incident light or radiation that could be within any portion of the light spectrum.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on" another element or layer, it can be directly or indirectly formed on the other element or layer. That is, for example, intervening elements or layers may be present. In contrast, when an element or layer is referred to as being "directly formed on," to another element, there are no intervening elements or layers present. Similarly, when an element or layer is referred to as being "disposed on" another element or layer, it can be directly or indirectly disposed on the other element or layer. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

The term "have", "may have", "include", "may include" or "comprise" used herein indicates the existence of a corresponding feature (e.g., a number, a function, an operation, or an element) and does not exclude the existence of an additional feature.

The term "A or B", "at least one of A and/or B", or "one or more of A and/or B" may include all possible combinations of items listed together. For example, the term "A or B", "at least one of A and B", or "at least one of A or B" may indicate all the cases of (1) including at least one A, (2) including at least one B, and (3) including at least one A and at least one B.

It will be understood that when a certain element (e.g., a first element) is referred to as being "operatively or communicatively coupled with/to" or "connected to" another element (e.g., a second element), the certain element may be coupled to the other element directly or via another element (e.g., a third element). However, when a certain element (e.g., a first element) is referred to as being "directly coupled" or "directly connected" to another element (e.g., a second element), there may be no intervening element (e.g., a third element) between the element and the other element.

The term "configured (or set) to" may be interchangeably used with the term, for example, "suitable for", "having the capacity to", "designed to", "adapted to", "made to", or "capable of". The term "configured (or set) to" may not necessarily have the meaning of "specifically designed to". In some cases, the term "device configured to" may indicate that the device "may perform" together with other devices or components. For example, the term "processor configured (or set) to perform A, B, and C" may represent a dedicated processor (e.g., an embedded processor) for performing a corresponding operation, or a generic-purpose processor (e.g., a CPU or an application processor) for executing at least one item of software or program stored in a memory device to perform a corresponding operation.

In the following description, numerous specific details are given to provide a thorough understanding of embodiments. The embodiments can be practiced without one or more of the specific details, or with other methods, components, materials, etc. In other instances, well-known structures, materials, or operations, such as, for example, processors, spectrometers, etc., are not shown or described in detail to avoid obscuring aspects of the embodiments.

Figure 5:
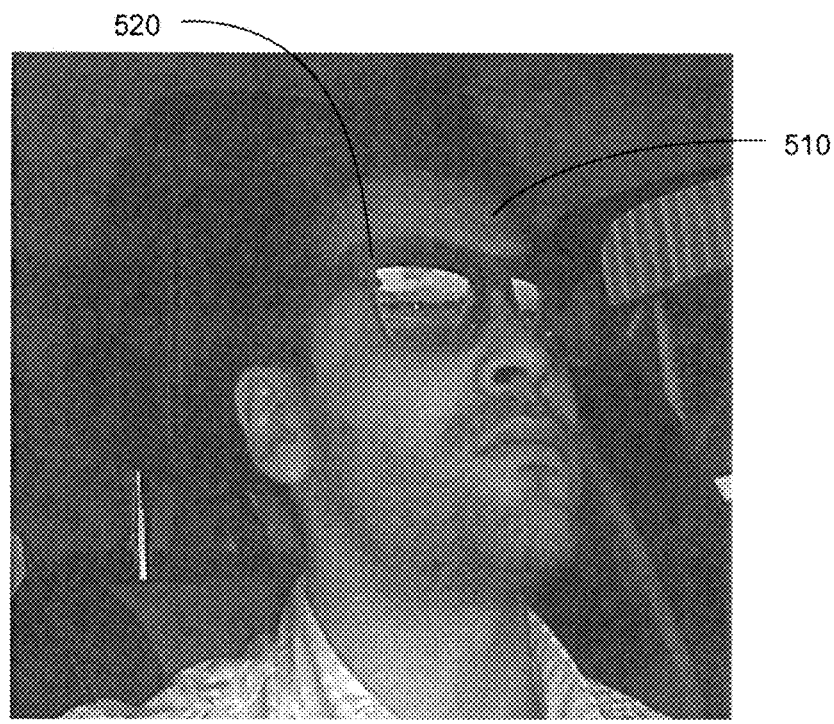
FIG. 5 illustrates a scenario of a driver wearing sunglasses inside cabinet of vehicle.

A typical RGB-IR image sensor has a pixel array comprising of a plurality of pixels including red (R) pixels, green (G) pixels, blue (B) pixels, and infrared (IR) pixels, arranged for sensing both visible light and infrared light. RGB-IR image sensor has been used in various applications such as surveillance camera, augment reality, virtual reality, and mixed reality RGB-IR image sensor may be further incorporated in a camera or imaging system for in-cabinet driver monitor i.e., monitor driver behavior and condition, such as eye movement tracking. It has been noted that when a driver 510 wears sunglasses 520 with metallic coating as illustrated in FIG. 5, metallic coating on sunglasses 520 would generate high reflection light that interferes with infrared light detection. Such high reflection light could cause one or more IR pixels to have high responses to visible light, which degrades infrared light sensitivity.

Figure 6:
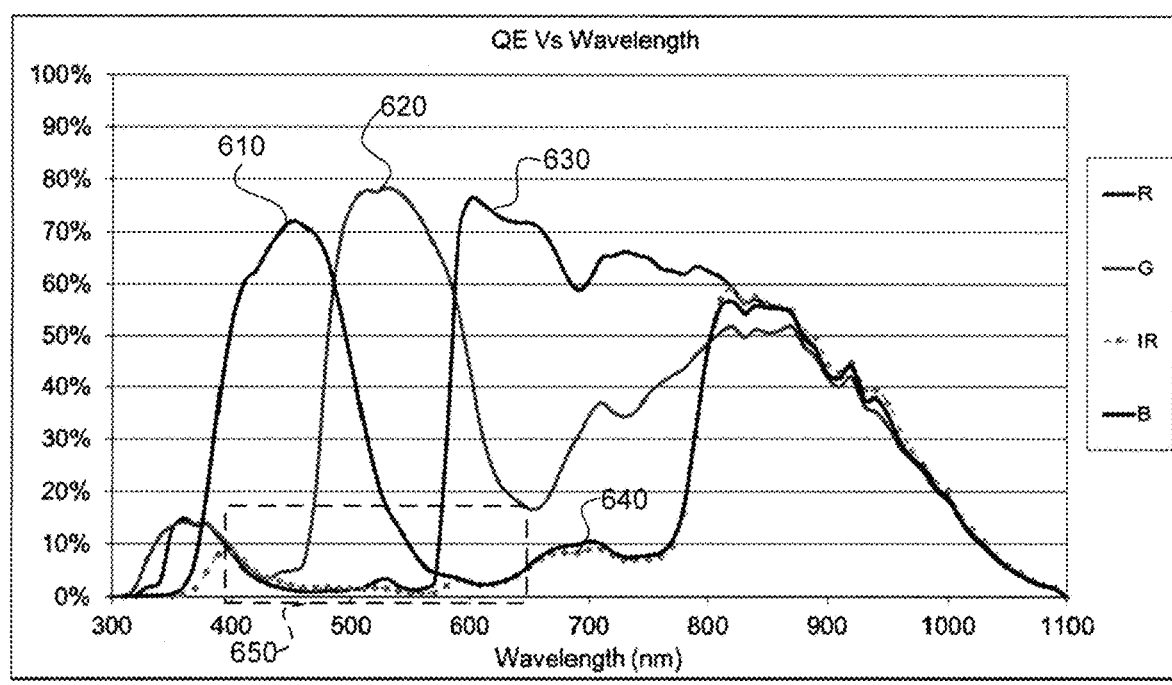
FIG. 6 illustrates a plot of wavelength versus quantum efficiently (QE) of a RGB-IR image sensor.

Referred to FIG. 6, which illustrates quantum efficiency (QE) responses associated with red, blue, green and infrared pixels of an RGB-IR sensor with respect to light wavelength. Curve 610 refers to a QE response of a blue (B) pixel. Curve 620 refers to a QE response of a green (G) pixel. Curve 630 refers to a QE response of a red (R) pixel. Curve 640 refers to a QE response of an infrared (IR) pixel. It has been observed that infrared pixel has about 2% or greater response in a visible light wavelength range between 400-650 nanometers as depicted by box 650. This QE response of IR pixel to visible light would increase significantly especially when the intensity of light outside of vehicle is much stronger than the light inside the cabinet.

The present disclosure provides an infrared filter structure for an infrared or IR pixel included in an image sensor (e.g., RGB-IR image sensor) that can effectively reduce infrared pixel's sensitivity to incident light in the range of visible light spectrum (such as between 400 nanometers to 650 nanometers), thus enhance infrared pixel's sensitivity.

FIG. 1 illustrates a block diagram of an imaging system for an image sensor 100, in accordance with an embodiment of the present disclosure. Imaging system 100 includes pixel array 105, control circuitry 121, readout circuitry 111, and function logic 115. In one embodiment, pixel array 105 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/pixel in pixel array 105 has acquired its image data or image charge, the image data is readout by readout circuitry 111 and then transferred to function logic 115. In various examples, readout circuitry 111 may include amplification circuitry, analog-to-digital (ADC) conversion circuitry, or otherwise. Function logic 115 may simply store the image data or even manipulate the image data by applying post image effects (e.g., autofocus, crop, rotate, remove red eye, adjust brightness, adjust contrast, or otherwise). In the same or another embodiment, readout circuitry 111 may readout a row of image data at a time along readout column lines (illustrated) or may readout the image data using a variety of other techniques (not illustrated), such as a serial readout or a full parallel readout of all pixels simultaneously. In one embodiment, control circuitry 121 is coupled to pixel array 105 to control operation of the plurality of image sensor pixels in pixel array 105. For example, control circuitry 121 may generate a shutter signal for controlling image acquisition. In some embodiments, control circuitry 121 may be configured to generate drive signals e.g., transfer signals, reset signals, and row-select signals for controlling the operation of pixel circuitries associated with image sensor pixels in pixel array 105.

It is appreciated that imaging system 100 may be included in a digital camera, cell phone, laptop computer, automobile, surveillance camera or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

While the block diagram illustrated in FIG. 1 shows pixel array 105, readout circuitry 111, function logic 115, and control circuitry 121 as distinct and separate elements from the pixel array, it should be appreciated that this is not necessarily the case as such features may be combined or otherwise incorporated with the pixel array directly (e.g., within and/or between individual pixels, in the form of stacked substrates, or otherwise). For example, the readout circuitry 111 may include one or more transistors (e.g., associated with 3T, 4T, 5T, or other pixel architectures for reading out image charge from individual pixels), elements of which may be disposed between segments of individual photodiodes in accordance with embodiments of the present disclosure. Furthermore, the imaging system 100 may include features not explicitly illustrated or discussed but known by one of ordinary skill in the art such as color filters, microlenses, a metal grids, and the like. Additionally, it is appreciated that imaging system 100 may be included in an image sensor that is fabricable by conventional CMOS manufacturing techniques known by one of ordinary skill in the art, which may include, but is not limited to, photolithography, chemical vapor deposition, physical vapor deposition, atomic layer deposition, ion implantation or diffusion, thermal oxidation, reactive ion etching, wet chemical etching, chemical mechanical polishing, and the like.

Figure 2:
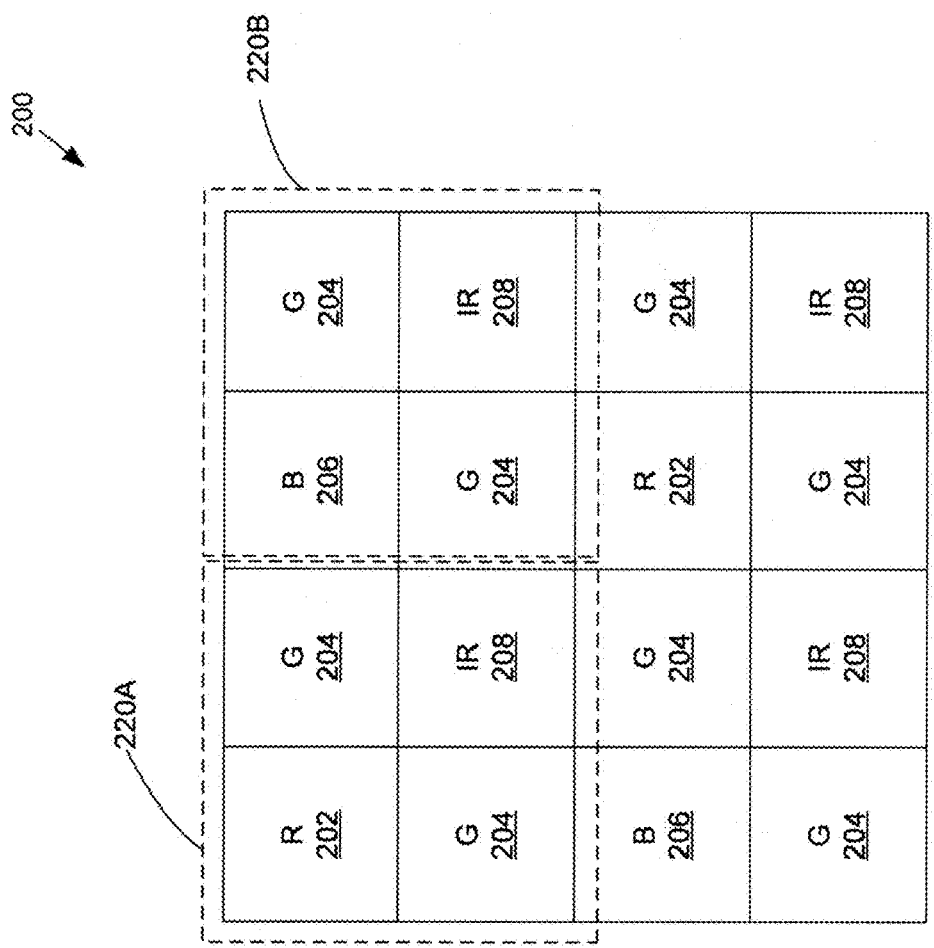
FIG. 2 illustrates an example pixel array of a RGB-IR image sensor in accordance with the teachings of the present disclosure.

It is appreciated a pixel array 200 of FIG. 2 is an example of the pixel array 105 as shown in FIG. 1, and that similarly named and numbered elements described above are coupled and function similarly below. Pixel array 200 may be incorporated into a RGB-IR type image sensor. Pixel array 200 includes of a plurality of pixels. The plurality of pixels may include red (R) pixels 202, green (G) pixels 204, blue (B) pixels 206 and infrared (IR) pixels 208. The plurality of pixels may be arranged according to Bayer pattern or other suitable mosaic of red, green, blue, and infrared pixels depending on imaging application. In some embodiments, the plurality of pixels may be arranged in a repeating pattern such as arranged in a repeating pattern having a minimal repeating unit including at least four rows and four columns as illustrated in FIG. 2.

The plurality of pixels may be grouped into a plurality of first pixel blocks 220A and a plurality of second pixel blocks 220B, each formed of 2×2 pixels. Each of first pixel blocks 220A may include an R pixel 202, two G pixels 204, and an IR pixel 208. Each of second pixel blocks 220B may include a B pixel 206, two G pixels 204, and an IR pixel 208. The plurality of first pixel blocks 220A and the plurality of second pixel blocks 220B may be arranged in an alternating manner in a pixel array. In one example, the plurality of first pixel blocks 220A and the plurality of second pixel blocks 220B are arranged in a checkerboard pattern. Although not illustrated, in some embodiments, the plurality of pixels may be grouped into a plurality of pixel blocks with each pixel block formed of an R pixel 202, a G pixel 204, a B pixel 206, and an IR pixel 208.

In embodiments, the R pixels 202, the G pixels 204, and the B pixels 206 are configured to generate image signals in response to incident light in a visible light spectrum, which may range between 400 nanometers to 650 nanometers. For example, the R pixel 202 is configured to generate response to red portion of the incident light, which may range from 600 nanometers to 650 nanometers. The B pixel 206 is configured to generate response to blue portion of the incident light, which may range from 400 nanometers to 450 nanometers. The G pixel 204 is configured to generate response to green portion of the incident light, which may range from 500 nanometers to 550 nanometers. The IR pixel 208 is configured to generate response to infrared light in non-visible light spectrum eg., light having wavelength ranging from 800 nanometers to 3,000 nanometers. In some embodiments, a pixel size of each of the plurality of pixels is at least greater than 2 μm. In some embodiments, a pixel size of each of the plurality of pixels may range from 0.5 μm to 3 μm.

Figure 3:
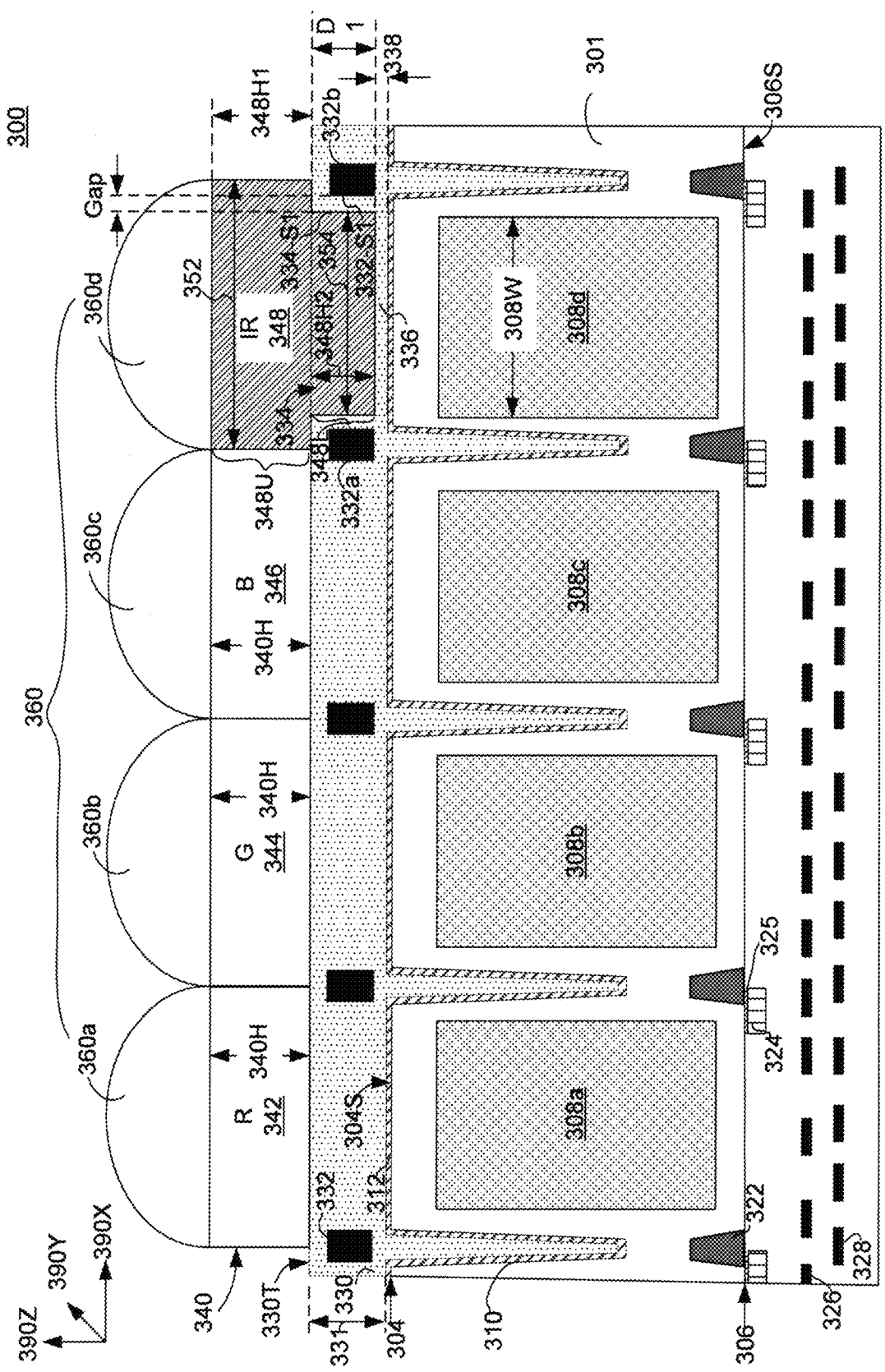
FIG. 3 illustrates a cross-sectional of an embodiment image sensor that in accordance with the teachings of the present disclosure.

FIG. 3 illustrates a cross-sectional of an image sensor in accordance with the teachings of the present disclosure. The cross-section illustrated in FIG. 3 is parallel to a plane, hereinafter the x-z plane, formed by orthogonal directions 390X and 390Z, which are each orthogonal to direction 390Y. Herein, the x-y plane is formed by orthogonal directions 390X and 390Y, and planes parallel to the x-y plane are referred to as transverse planes. Unless otherwise specified, heights of objects, thickness of objects, or depths of objects herein refer to the object's extent in direction 390Z, or a direction 180° opposite thereto. Herein, a reference to an axis x, y, or z or associated direction ±x, ±y, or ±z refers to directions 390X, 390Y, and 390Z respectively. Also, herein, a horizontal plane is parallel to the x-y plane, a width refers to an object's extension in the x-direction, and vertical refers to the z direction. The cross-sectional view shown in FIG. 3 may be a partial cross-section showing a region of pixels included in an array of pixels formed by the plurality of pixels. It is further appreciated that certain components may be omitted in FIG. 3 (e.g., pinning layer, doped well isolation region, floating diffusions, pixel transistors, contacts, contact pads, or the like) for clarity.

In the illustrated embodiment, an image sensor 300 includes a semiconductor substrate 301 (e.g., silicon, a silicon germanium alloy, germanium, a silicon carbide alloy, an indium gallium arsenide alloy, any other alloys formed of III-V compounds, other semiconductor materials or alloys, combinations thereof, a substrate thereof, a bulk substrate thereof, or a wafer thereof) with a first side 304 (e.g., a backside) and a second side 306 opposite to the first side 304 (e.g., a front side). In one or more embodiments, the first side 304 may be referred as an illuminated side or a light-incident side of the semiconductor substrate 301, and the second side 306 may be referred as a non-illuminated side of the semiconductor substrate 301. In embodiments, the semiconductor substrate 301 may have a substrate thickness between first side 304 and second side 306 that ranges between three micrometers to seven micrometers depending on image application.

The semiconductor substrate 301 includes a plurality of photodiodes 308a-308d forming a pixel array. For example, each of plurality of photodiodes 308a-308d can be included in a respective pixel in the pixel array 200 of FIG. 2. Each of plurality of photodiodes 308a-308d is isolated from each other. Each of plurality of photodiodes 308a-308d is configured to generate corresponding image signal in response to incident light directed thereto. Although only four photodiodes 308a-308d are illustrated herein, it is appreciated that the plurality of photodiodes included in the pixel array of the image sensor 300 may include more than four photodiodes or less than four photodiodes depending image sensor configuration.

The semiconductor substrate 301 also includes a plurality of first isolation structures 310, a plurality of second isolation structures 322, one or more layers 312, a buffer oxide layer 330, a color filter array 340, a microlens array 360, a plurality of transistor gates 324, a plurality of metal interconnects 328, and an inter-layer dielectric 326.

The plurality of first isolations structures 310 (eg., deep trench isolation structures formed of at least an oxide material) are arranged to electrically and optically isolate individual photodiodes (e.g., individual ones of the plurality of photodiodes 308a-308d).

Each of the plurality of first isolation structures 310 may extend from the first side 304 of the semiconductor substrate 301 towards the second side 306. The depth that each of the plurality of first isolation structure 310 may be less than the substrate thickness of the semiconductor substrate 301. In some embodiments, the plurality of first isolation structures 310 may be formed by filling trenches formed in the semiconductor substrate 301 with one or more dielectric materials (e.g., an oxide material, a dielectric material having an index of refraction lower than that of semiconductor substrate 301, a metal-oxide material, or combinations thereof). In some embodiments, the plurality of first isolation structures 310 may be formed by filling trenches with the one or more dielectric materials in combination with (e.g., sequentially or simultaneously) a reflective material such as metal material or a conductive material such as metal or polysilicon. In embodiments, the trenches of the plurality of first isolation structures 310 may be formed from a surface 304S (also referred as first surface 304S) of the first side 304 of the semiconductor substrate 301. The plurality of first isolation structures 310 may be interconnected forming an isolation grid surrounding each of photodiodes 308a-308d across array of photodiodes.

In an optional or alternative embodiment, the trenches of the plurality of first isolation structures 310 may be formed before the formation of the one or more layers 312, the buffer oxide layer 330, and any intermediary layers between one or more layers 312 and the buffer oxide layer 330 such that the isolation structure itself is formed from the one or more layers 312, the buffer oxide layer 330, and any intermediary layers between one or more layers 312 and the buffer oxide layer 330, which results in one or more layers 312, the buffer oxide layer 330, and any intermediary layers to extend into the trenches and collectively, continuously and conformally line sidewalls of each of the trenches of the plurality of first isolation structures 310.

The plurality of second isolation structures 322 may be disposed on second side 306 of the semiconductor substrate 301. Each of plurality of second isolation structure 322 may extend from second side 306 into the semiconductor substrate 301 toward first side 304. Each of plurality of second isolation structures 322 may include a trench filled with dielectric material such as silicon oxide and provide electrical isolation between adjacent photodiodes and between photodiodes and adjacent transistor region having at least a pixel transistor 324 associated with at least one of the photodiodes 308a-308d. In embodiments, the trenches of the plurality of second isolation structures 322 may be formed by a surface 306S (also referred as second surface 306S) of the second side 306 of the semiconductor substrate 301. The second surface 306S is opposite to the first surface 304S. In the illustrated embodiments, when the first side 304 is the backside of the semiconductor substrate 301 and the second side 306 is the front side of the semiconductor substrate 301, the first surface 304S may be referred as the back surface, and the second surface 306S may be referred as the front surface in accordance to present disclosure. A depth extended by each of the plurality of second isolation structures 322 into the semiconductor substrate 301 with respect to surface 306S of the second side 306 may be less than the depth that each of the plurality of first isolation structures 310 extends into the semiconductor substrate 301 with respect to surface 304S of the first side 304. The plurality of second isolation structures 322 may be referred as shallow trench isolation structures. In the illustrated embodiment, each of the plurality of second isolation structures 322 is vertically aligned with each of respective first isolations structures 310. In some embodiments, each of first isolations structure 310 may extends toward second side 306 and landed on each of respective second isolations structure 322.

One or more layers 312 may be disposed on the first surface 304S of the first side 304 of the semiconductor substrate 301. The one or more layers 312 may be a continuous layer that line trench sidewall of first isolation structures 310 and surrounds filled dielectric material. For example, the one or more layers 312 may include a passivation layer that may line or otherwise be included in the plurality of first isolation structures 310 surrounding filled dielectric material disposed within the trench (e.g., a portion of a buffer oxide layer 330 that forms or is otherwise included in the plurality of isolation structures 310) to induce a hole accumulation region surrounding the trenches of first isolation structures so as to passivate surface defects and trench sidewall defects that may occur during fabrication (e.g., reduce or otherwise mitigate material induced stress or etching damage). The passivation layer may comprise of material having negative fixed charges. In one example, the passivation layer comprises of high k material i.e., a material with a dielectric constant greater than 3.9 containing negative fixed charges, such as hafnium oxide (e.g., $HfO_2$), aluminum oxide (e.g., $Al_2O_3$), zirconium oxide (e.g., $Zr_2O_3$), or combinations thereof.

One or more layers 312 may further include an anti-reflective layer on the passivation layer on first surface 304S of first side 304 of semiconductor substrate 301. In some embodiments, the anti-reflective layer 150 may include tantalum oxide ($Ta_2O_5$), hafnium oxide ($HfO_2$), aluminum oxide ($Al_2O_3$), zirconium oxide ($Zr_2O_3$), or combinations thereof. In one or more embodiments, the anti-reflective layer is between 50 nm thick and 100 nm thick along direction 390Z. In some embodiments, a thickness of a first portion of the anti-reflective layer on the first surface 304S of the first side 304 of the semiconductor substrate 301 may be greater than a thickness of the corresponding portion of the passivation layer on the first surface 304S of the first side 304 of semiconductor substrate 301. The thickness of the first portion of anti-reflective layer disposed on the first surface 304S of the first side 304 of the semiconductor substrate 301 may be also greater than a second portion of the anti-reflective layer lining the sidewalls of each of the trenches of the plurality of first isolation structures 310 in the semiconductor substrate 301.

The buffer oxide layer 330 is a planarized dielectric layer that is disposed on one or more layers 312 on first surface 304S. The buffer oxide layer 330 may have a thickness 331 that is at least 500 nanometers along direction 390Z. In at least one embodiment, the buffer oxide layer 330 is disposed directly on the anti-reflective layer. In one embodiment, the thickness 331 of buffer oxide layer 330 may range from 500 nanometers to 1300 nanometers. The buffer oxide layer 330 further includes a plurality of metal structure 332, and each of the plurality of metal structure 332 align with each respective first isolations structure 310. The plurality of metal structure 332 are interconnected in a grid-form forming a plurality of apertures aligned with each photodiodes 308a-308d. The plurality of metal structure 332 may function as a light guide for directing incident light toward respective photodiode while suppressing crosstalk between adjacent photodiodes. Each of metal structure 332 is separated from first surface 304S of first side 304 by at least the buffer oxide layer 330.

The buffer oxide layer 330 may be formed on oxide-based material such as silicon dioxide. The buffer oxide layer 330 further include a recessed region 334 aligned with a photodiode that is configured for sensing infrared light e.g., photodiode 308d. The recessed region 334 has a recess width 354 along direction 390X and a depth D1 with respect to a top surface 330T of buffer oxide layer 330 along a depth-wise direction (e.g., direction 390Z). The recess width 354 may be less than a spacing between adjacent metal structures 332 (e.g., the spacing between metal structures 332a, 332b) such there is buffer oxide layer material in between metal structures 332 and later-disposed infrared filter material providing material isolation between infrared filter material and adjacent metal structures 332. The recess width 354 may be less than a pixel width of photodiode 308d along direction 390X. In some embodiments, the recess width 354 may be substantially equal or less than a lateral or horizontal width 308W of photodiode 308d along direction 390X. The depth D1 of the recessed region 334 may be less than the thickness 331 of the buffer oxide layer 330 to prevent processing damage, such as etching damage to the underlying material e.g., one or more layers 312, substrate surface (e.g., surface 304S) of the semiconductor substrate 301. In illustrated embodiments, the buffer oxide layer 330 includes a thin region 336 between recessed regions 334 and the one or more layers 312, wherein the thickness 338 of the thin region 336 is at least greater than 500 angstroms providing process protection to underlying layers. In some embodiments, the thickness of the thin region 336 may be configured based on process consideration (e.g., process variation) providing an upper bound to the depth D1. In the illustrated embodiments, there is a spacing GAP between recessed region 334 and adjacent metal structures 332 (i.e., spacing GAP between metal structures 332a, 332b). For example, the spacing GAP is in between a side wall 334-S1 of the recessed region 334 and a side wall 332-S1 of proximate metal structure 332b.

The color filter array 340 is disposed on the buffer oxide layer 330. The buffer oxide layer 330 is disposed between the color filter array 340 and first surface 304S and the recessed region 334 is between color filter array 340 and photodiode 308d. The color filter array 340 includes a plurality of color filters aligned with the plurality of photodiodes (e.g., photodiodes 308a-308d). The plurality of color filters at least includes a red color filter 342 aligned with photodiode 308a, a green color filter 344 aligned with photodiode 308b, a blue color filter 346 aligned with photodiode 308c, and an infrared filter 348 aligned with photodiode 308d. The red color filter 342 may filter directed incident light and transmit light in wavelength of 600 nanometers to 650 nanometers toward photodiode 308a. Red color filter 342 and underlying photodiode 308a form a red color pixel. The green color filter 344 may filter directed incident light and transmits light in wavelength of 500 nanometers to 550 nanometers toward photodiode 308b. Green color filter 344 and underlying photodiode 308b form a green color pixel. The blue color filter 346 may filter directed incident light and transmits light in wavelength of 400 nanometers to 450 nanometers toward photodiode 308c. Blue color filter 346 and underlying photodiode 308c form a blue color pixel. The infrared filter 348 may filter directed incident light and transmits light in wavelength of 800 nanometers to 3,000 nanometers toward photodiode 308d. Infrared filter 348 and underlying photodiode 308d form an infrared pixel.

In embodiments, the red color filter 342, the green color filter 344, the blue color filter 346 and the infrared filter 348 are disposed on buffer oxide layer 330. The red color filter 342, the green color filter 344, the blue color filter 346 and the infrared filter 348 may be in direct contact the buffer oxide layer 330. Restated, each of the red color filter 342, the green color filter 344, the blue color filter 346 and the infrared filter 348 may disposed directly on the buffer oxide layer 330. Each of the red color filter 342, the green color filter 344, the blue color filter 346, and the infrared filter 348 may be aligned with the plurality of apertures defined by the plurality of metal structures 332.

The infrared filter 348 is further disposed in the recessed region 334 on thin region 336 of the buffer oxide layer 330 such that a height of the infrared filter 348 is greater than a height of each of red color filter 342, the green color filter 344, and the blue color filter 346. In embodiments, each of visible light color filters (e.g., red color filter 342, green color filter 344, or blue color filter 346) does not extend into the buffer oxide layer 330.

The infrared filter 348 includes an upper portion 348U (first portion) disposed on buffer oxide layer 330 above metal structure 332, and a lower portion 348L (second portion) disposed in the recessed region 334. The upper portion 348U has a first height 348H1 with respect to top surface 330T of buffer oxide layer 330 along a direction normal to surface 304S (e.g., along direction 390Z). The lower portion 348L has a second height 348H2 substantially equal to depth D1 of recessed region 334. Each of the red color filter 342, the green color filter 344, and the blue color filter 346 has a height 340H with respect to top surface 330T of buffer oxide layer 330 that may be the same as the first height 348H1 of the upper portion 348U, while the infrared filter 348 has a combined height of first height 348H1 and second height 348H2. Stated differently, the infrared filter 348 has a total thickness along a depth-wise direction (e.g., direction 390Z) that is in perpendicular to first surface 304S of the first side 304 being greater than the thickness (e.g., height 340H) of each of the red color filter 342, the green color filter 344, and the blue color filter 346 along the depth-wise direction. As such, the sensitivity or response of an infrared pixel formed of infrared filter 348 and photodiode 308d to the visible light can be effectively lowered or reduced, thereby improve infrared detection of image sensor 300 even in a situation where background or ambient light have strong intensity in visible light range as illustrated in FIG. 5. In addition, the overall stack height of color filter and buffer oxide layer 330 remain unchanged, thus optical performance (e.g., angular response) is not affected. Because height 348H1 of the infrared filter 348 above the buffer oxide layer 330 can be the same as the height 340H of each individual visible light color filters (e.g., red color filter 342, green color filter 344, or blue color filter 346), and the metal structures 332 embedded in the buffer oxide layer 330 can prevent filtered infrared light that is directed to the photodiode 308d of the infrared pixel from crosstalk over to adjacent visible light color pixels, crosstalk performance can be improved.

By extending part of infrared filter 348 into buffer oxide layer 330 in according the present disclosure, allows a thicker infrared filter to be formed enhancing infrared light filtering performance for corresponding infrared pixel, thereby increase infrared light sensitivity without degrading crosstalk performance between infrared pixel and adjacent visible light color pixels such as blue color pixel.

In embodiments, the upper portion 348U of the infrared filter 348 may have width 352 along a horizontal direction (e.g., direction 390X) parallel to first surface 304S of first side 304 that is greater than width 354 of the lower portion 348L along the horizontal direction (e.g., direction 390X). The width 352 of the upper portion 348U of the infrared filter 348 may be greater than the width 308W of photodiode 308d along a horizontal direction e.g., direction 390X, and the width 354 of the lower portion 348L of the infrared filter 348 may be less than the width 308W of photodiode 308d along a horizontal direction e.g., direction 390X. Such infrared filter structure may ensure that all light directed toward photodiode 308d can be filtered by the infrared filter 348 before reaching photodiode 308d through first side 304, and crosstalk between a given infrared pixel and adjacent visible light color pixels may also be minimized (e.g., crosstalk can be prevented or reduced by the corresponding metal structures). In embodiments, the upper portion 348U and the lower portion 348L are monolithically formed of same type material for better infrared light filtering performance. For example, the infrared filter 348 is entirely formed of a single infrared filter material.

The microlens array 360 is disposed on the color filter array 340. The microlens array 360 includes a plurality of microlenses 360a-360d aligned with corresponding photodiodes 308a-308d. Each of plurality of microlenses 360a-360d is configured to direct incident light to corresponding photodiodes 308a-308d. The microlens 360a is configured to direct incident light to photodiode 308a. The microlens 360b is configured to direct incident light to photodiode 308b. The microlens 360c is configured to direct incident light to photodiode 308c. The microlens 360d is configured to direct incident light to photodiode 308d. Incident light that is directed to a respective photodiode may pass through corresponding color filters, corresponding apertures defined by metal structure 332, buffer oxide layer 330, one or more layers 312 before reaching to corresponding photodiodes 308a-308d.

The plurality of transistor gates 324 is disposed proximate to second side 306, and may be coupled to one of the photodiodes 308a-308d. A gate insulation layer 325 may be disposed between the second surface 306S and the plurality of transistor gates 324. The plurality of metal interconnects 328 may be embedded in the inter-layer dielectric 326 disposed on the second surface 306S of the second side 306 of the semiconductor substrate 301. The plurality of metal interconnects 328 may be part of multi-layer interconnect structure for routing control signals to transistor gates 324 controlling operation of photodiode 308a-308d and outputting image signal to read out circuitry.

FIGS. 4A-4G show cross-sectional figures illustrating a process in sequential order for fabricating an image sensor with respective infrared filter structure, in accordance with the teachings of the present disclosure. The cross-section illustrated in FIGS. 4A-4G is parallel to a plane, hereinafter the x-z plane, formed by orthogonal directions 490X and 490Z, which are each orthogonal to direction 490Y. The process illustrated by FIGS. 4A-4G may be one possible implementation for fabricating the image sensor 300 illustrated in FIG. 3. Accordingly, it is appreciated that like-labeled features may share similar or identical attributes (e.g., composition, relative arrangement with other components, shape, function, or the like). For example, the process illustrated in FIGS. 4A-4G includes semiconductor substrate 401, which may be the same or similar to the semiconductor substrate 301 illustrated in FIG. 3, in accordance with the teachings of the present disclosure. Additionally, it is appreciated that certain components may be omitted in FIGS. 4A-4G (eg., microlenses, or the like) for clarity and/or brevity. The process illustrated in FIGS. 4A-4G include, in one or more of the aforementioned figures, semiconductor substrate 401 having a first side 404 and a second side 406 opposite the first side 404, a plurality of photodiodes at least including photodiodes 408a-408d, one or more layer 412, a buffer oxide layer 430, a plurality of metal structures 432, a color filter array 440, a plurality of first isolations structures 410, a plurality of second isolations structures 422, a plurality of transistor gates 424, and a plurality of metal interconnects 428 embedded in an inter-layer dielectric 426. The cross-sectional views shown in FIGS. 4A-4G may be representing a partial cross-section showing a region of pixels included in a pixel array (eg., pixel array 105 of FIG. 1) formed by the plurality of pixels.

Figure 4A:
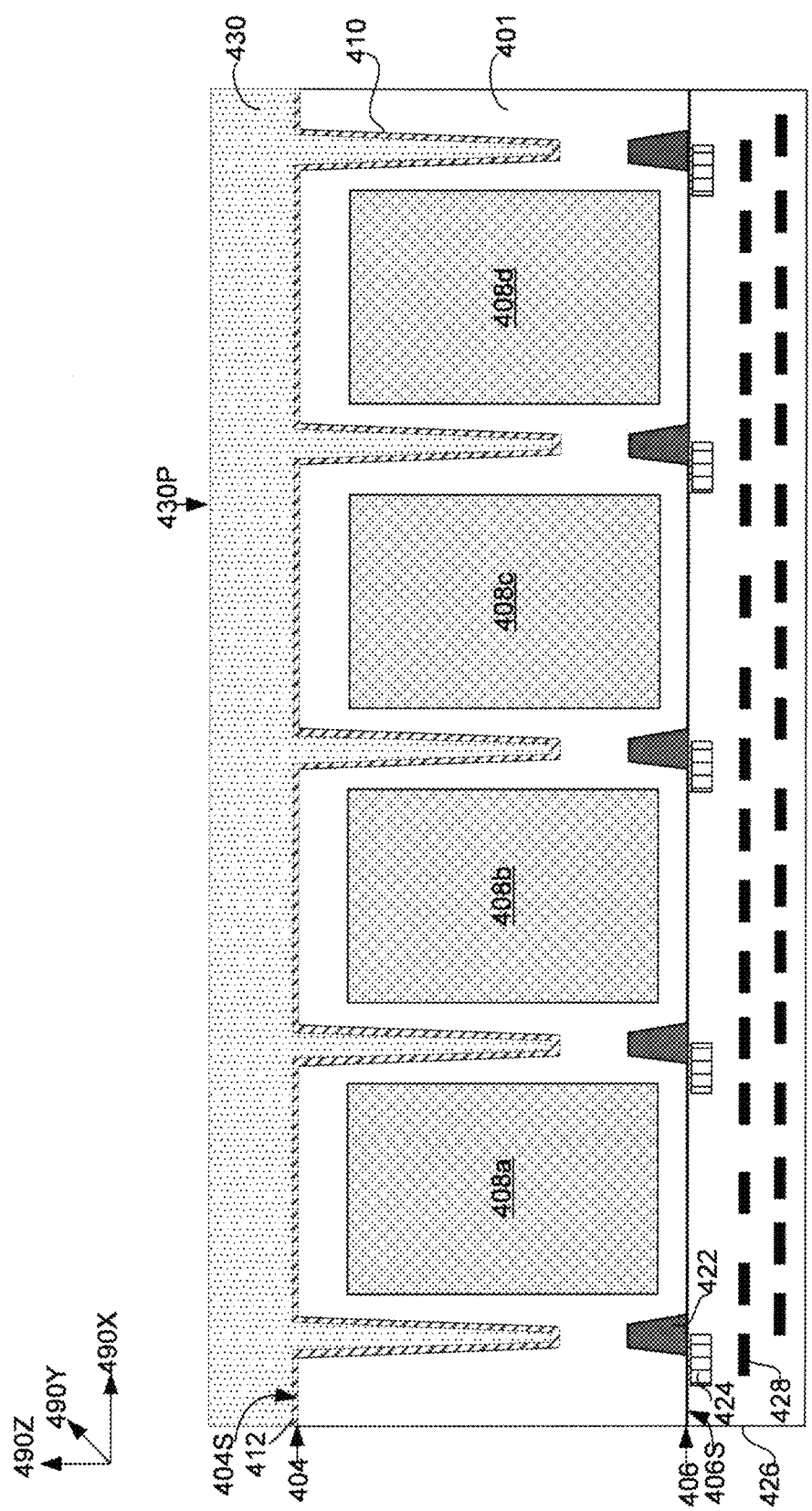
FIGS. 4A-4G illustrate a fabrication process for fabricating an image sensor with respective infrared filter structure, in accordance with the teachings of the present disclosure.

FIG. 4A illustrates providing the semiconductor substrate 401 having the first side 404 (or illuminated side) and the second side 406 opposite the first side 404. The semiconductor substrate 401 includes the plurality of photodiodes 408a-408d forming a pixel array. Each of the plurality of photodiodes (e.g., photodiodes 408a-408d) is disposed in the semiconductor substrate 401, for example by ion implantation. Each of plurality of photodiodes (e.g., photodiodes 408a-408d) may be a pinned photodiode, unpinned photodiode, or a partially pinned photodiode. The semiconductor substrate 401 may be a semi-fabricated substrate, such as a semiconductor substrate after a front-end processing. For example, the semiconductor substrate 401 may have the plurality of second isolations structures 422, the plurality of transistor gates 424, and the plurality of metal interconnects 428, and the inter-layer dielectric 426 already being formed on the second surface 406S of the second side 406 thereof.

The semiconductor substrate 401 may have an oxide-based dielectric material (such as silicon dioxide) deposited on first surface 404S of the first side 404, followed by a planarizing process to form the buffer oxide layer 430 having a planarized top surface 430P. The first surface 404S is opposite to second surface 406S. Although not illustrated, in some embodiments and prior to the formation of buffer oxide layer 430, a plurality of isolation trenches may be formed in the semiconductor substrate 401 surrounding each individual photodiode 408a-408d by masking and etching process. One or more layers 412 including a passivation layer and anti-reflective layer, and oxide-based dielectric material forming the buffer oxide layer 430 may be disposed on the first side 404 of the semiconductor substrate 401 and into the plurality of isolation trenches to line or otherwise coat the bottom surface and sidewalls of the plurality of isolation trenches (e.g., by chemical vapor deposition, physical vapor deposition, or atomic layer deposition).

In some embodiments, after the formation of one or more layers 412 lining trench surfaces of the plurality of isolation trenches, the plurality of isolation trenches may then fill with one or more dielectric materials (e.g., an oxide-based material, low-n material, other dielectric materials, or combinations thereof) to form the plurality of isolation structures 410 to electrically and/or optically isolate individual photodiodes from one another. In one embodiment, the deposition of an oxide-based dielectric material for forming the buffer oxide layer 430 may include depositing one or more oxide-based dielectric materials (such as silicon oxide) into the plurality of isolation trenches to form the plurality of first isolation structures 410 electrically/optically isolating adjacent photodiodes 408a-408d. Each of the plurality of first isolation structures 410 may be aligned with each respective second isolation structure 422.

Figure 4B:
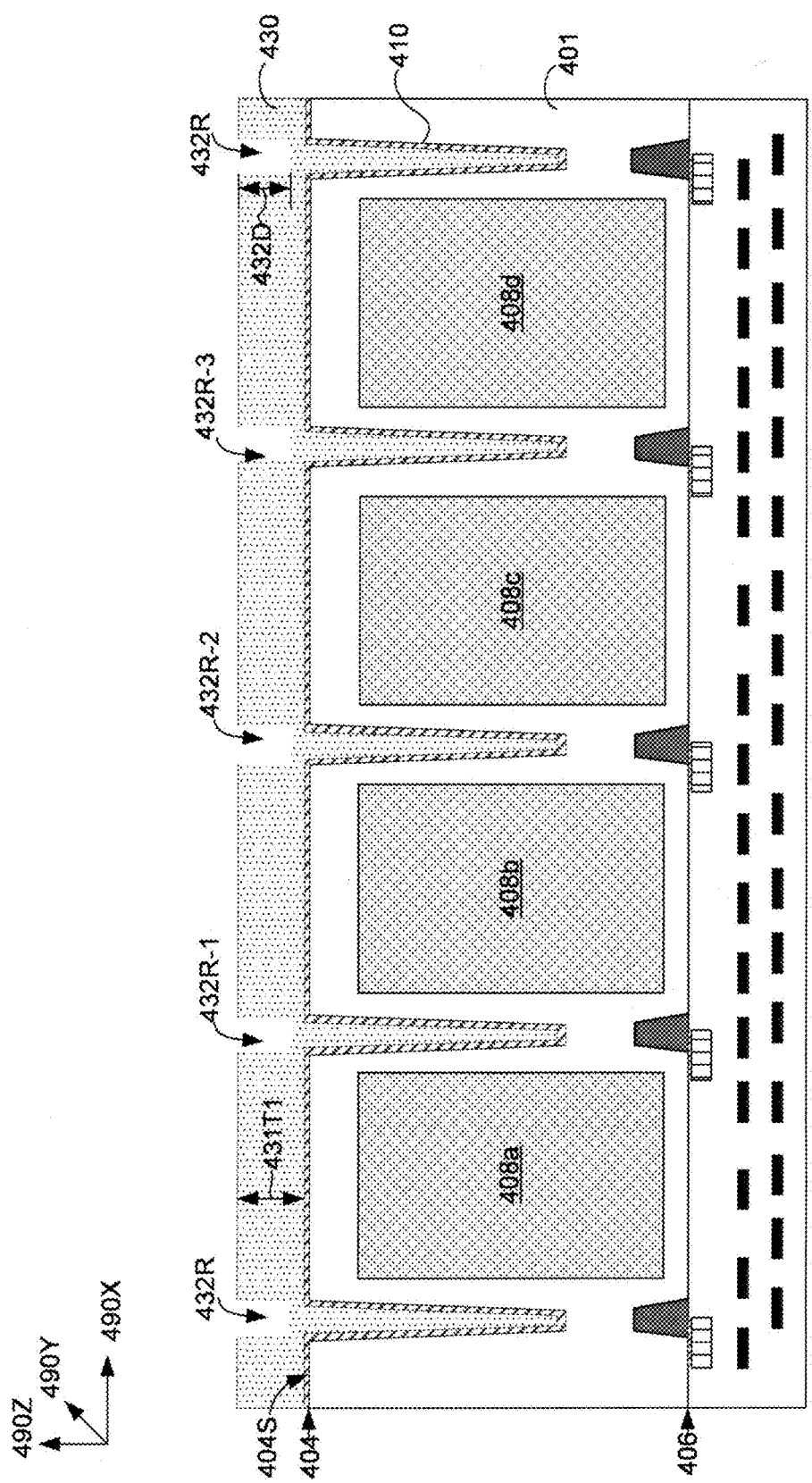

FIG. 4B is subsequent to FIG. 4A and shows patterning and etching to form a plurality of trenches 432R in the buffer oxide layer 430. Each of plurality of trenches 432R (e.g., trenches 432R-1, trenches 432R-2, trenches 432R-3 or any other unlabeled trenches on FIG. 4B) may be aligned with each of plurality of first isolation structures 410. Each of the trenches 432R is located in between adjacent photodiodes. For example, trenches 432R-1 is located between photodiode 408a and photodiode 408b, trenches 432R-2 is located between photodiode 408b and photodiode 408c, and trenches 432R-3 is located between photodiode 408c and photodiode 408d. Each of the trenches 432R (e.g., trenches 432R-1, trenches 432R-2, trenches 432R-3 or any other unlabeled trenches on FIG. 4B) has a depth 432D that may be less than a thickness 431T1 of the buffer oxide layer 430 shown in FIG. 4B. Stated differently, there is buffer oxide layer material disposed between each of trenches 432R (e.g., trenches 432R-1, trenches 432R-2, trenches 432R-3 or any other unlabeled trenches on FIG. 4B) and the one or more layers 412.

Figure 4C:
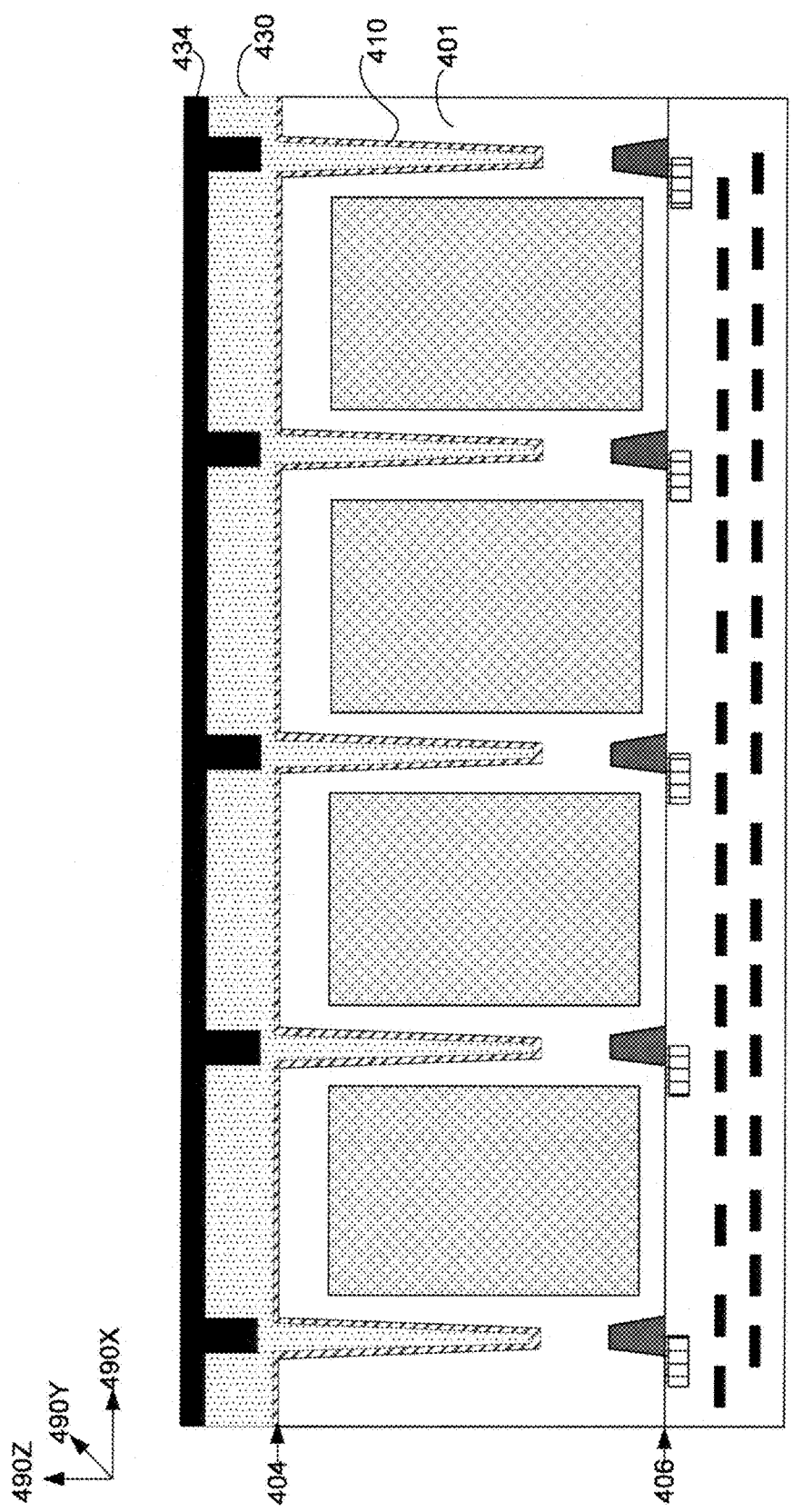

FIG. 4C may follow FIG. 4B and illustrates depositing metal material 434 on buffer oxide layer 430 and filling each of the plurality of trenches 432. A planarizing process such as chemical mechanical polishing may be applied to deposited metal material 434. The metal material 434 may comprise of tungsten or aluminum.

Figure 4D:
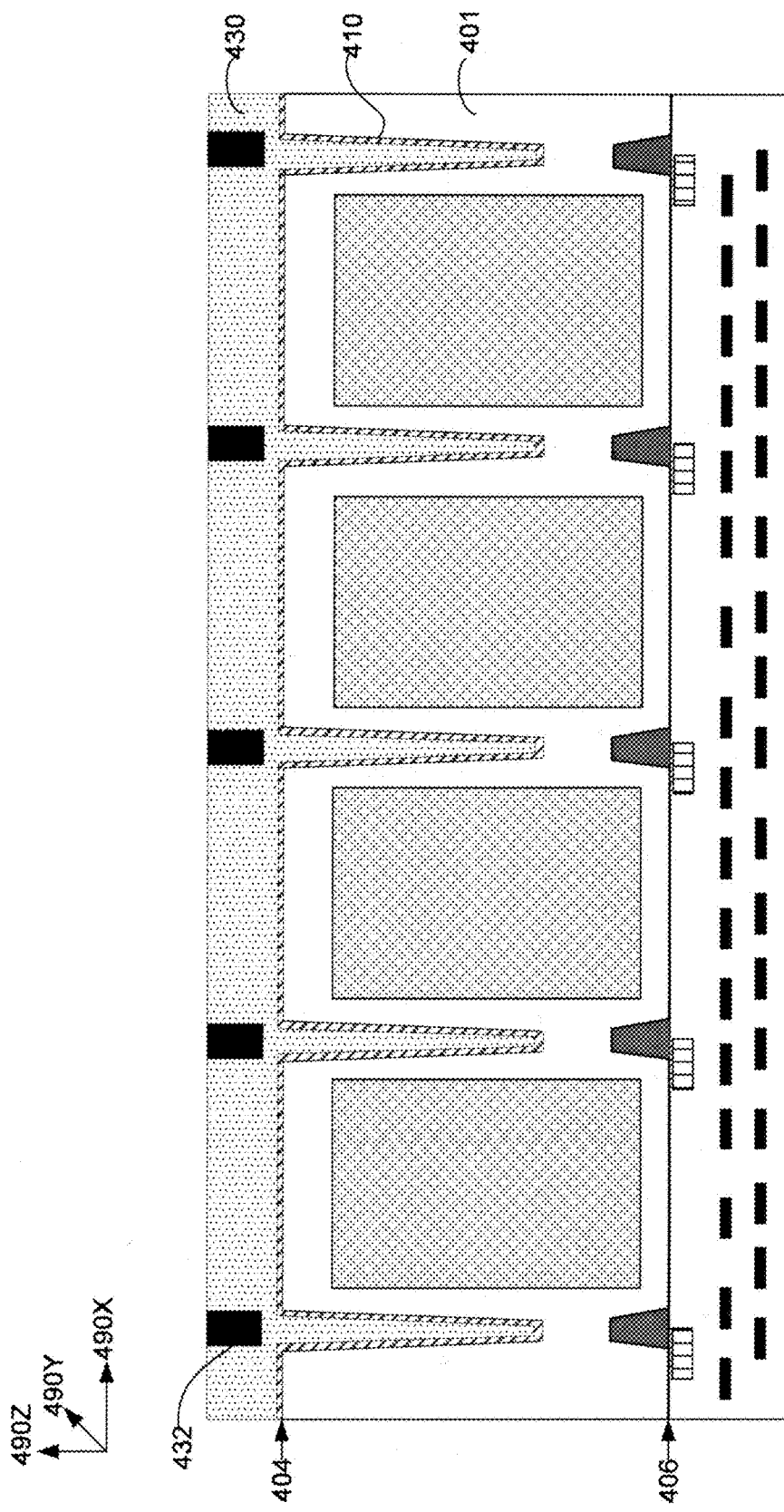

FIG. 4D may follow FIG. 4C and illustrates removing excess metal material 434 on buffer oxide layer 430, for example by an etching process such that metal material 434 above each individual photodiodes (e.g., photodiodes 408a-408d) are removed and metal material deposited into the plurality of trenches 432R remained forming a plurality of metal structures 432. The plurality of metal structures 432 may be interconnected forming a metal grid array defining a plurality of apertures for each individual photodiodes (e.g., photodiodes 408a-408d).

Figure 4E:
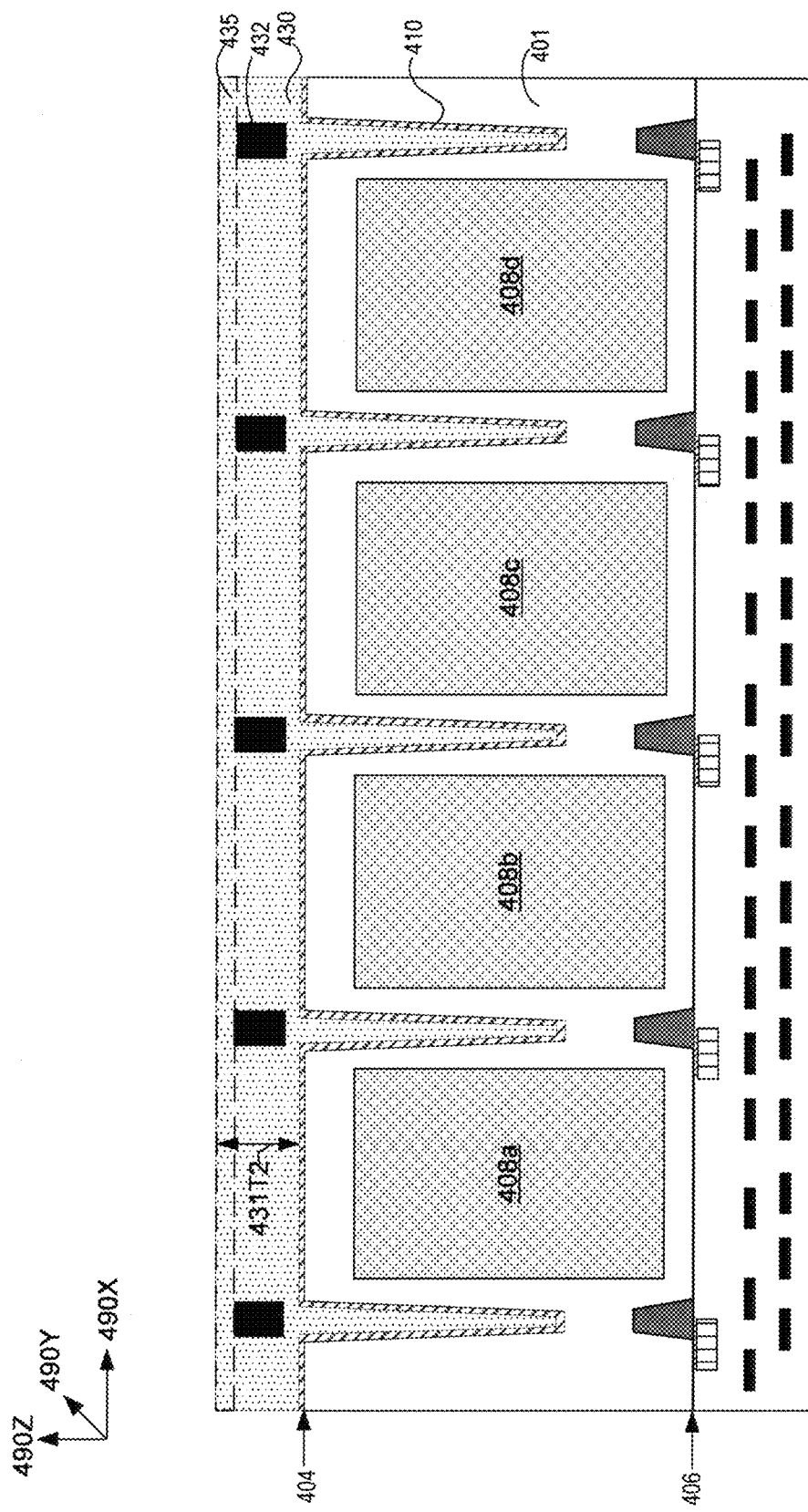

FIG. 4E may follow FIG. 4D and illustrates depositing additional oxide-based material 435 on buffer oxide layer 430 and the plurality of metal structures 432 such that the metal structures 432 are enclosed or embedded within buffer oxide layer 430 and additional oxide-based material 435 layer. The additional oxide-based material 435 layer and buffer oxide layer 430 may be of same material process and become part of buffer oxide layer 430 having a thickness 431T2 along a depth-wise direction (e.g., direction 490Z). The plurality of metal structures 432 may at least in part define a plurality of apertures aligned with the plurality of photodiodes 408a-408d. The plurality of metal structures 432 may help mitigate electrical and optical crosstalk between adjacent photodiodes.

Figure 4F:
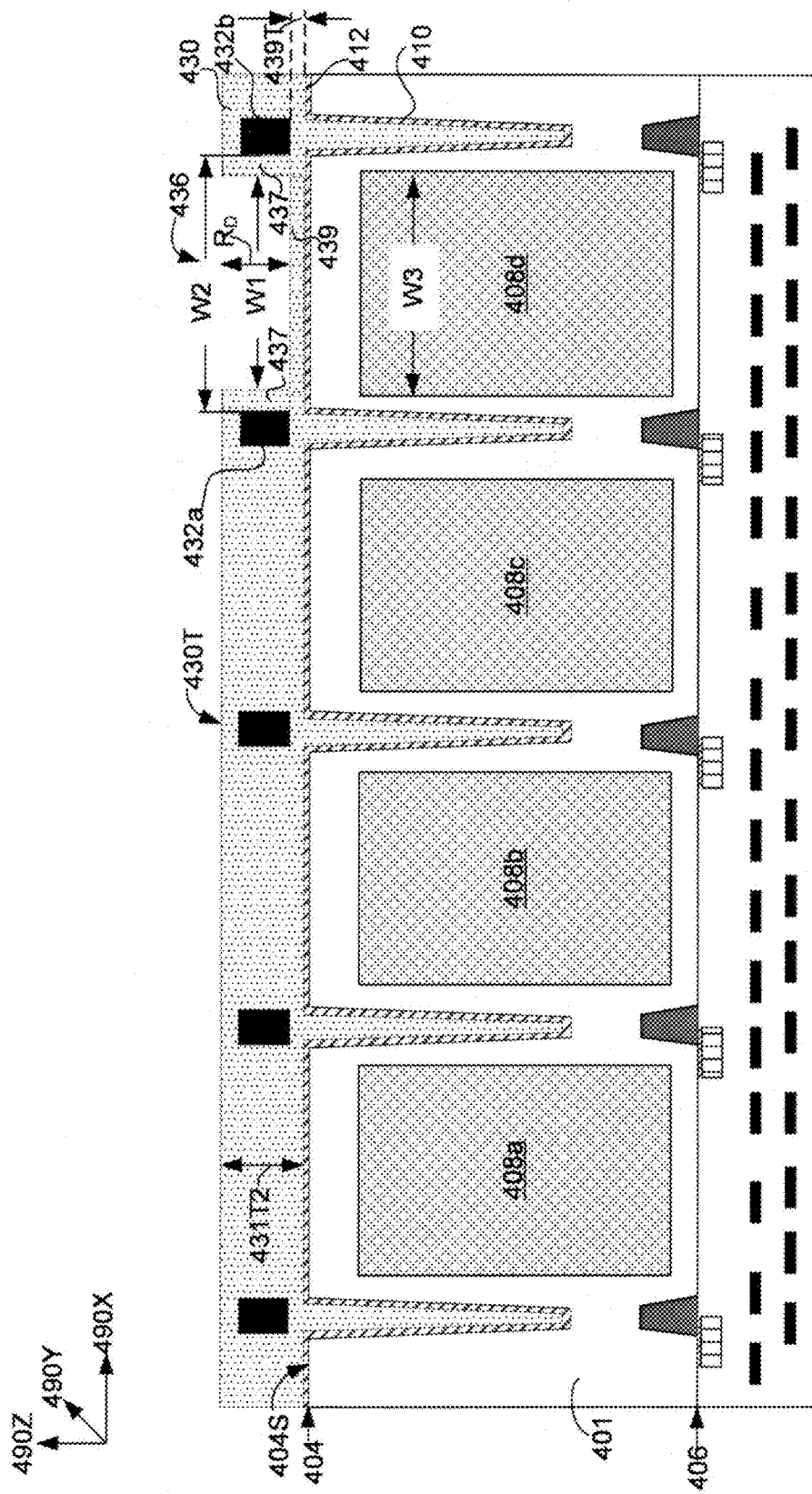

FIG. 4F is after FIG. 4E and shows selectively etching the buffer oxide layer 430 to a depth above photodiodes (e.g., photodiode 408d) for infrared sensing to form a plurality of recessed regions 436 aligned and above photodiodes (e.g., photodiode 408d) for infrared sensing. In embodiments, thickness 431T2 of buffer oxide layer 430 may range from 500 nanometers to 1300 nanometers along z-direction (e.g., direction 490Z). The illustrated recessed region 436 has a depth RD with respect to a top surface 430T of buffer oxide layer 430 along the depth-wise direction (e.g., direction 490Z) less than the thickness 431T2 of buffer oxide layer 430 to form thin region 439 of buffer oxide layer 430 between recessed regions 436 and one or more layers 412. That is, in the illustrated embodiment, the etching process for forming recessed regions 436 does not expose underlying layers nor the first surface 404S of the semiconductor substrate 401. The thin region 439 may have a thickness 439T that is about 500 angstroms. In some embodiments, the thickness 439T of thin region 439 is greater than zero angstroms but less than 1000 angstroms. The thin region 439 prevent etching damage to underlying one or more layers 412 and substrate surface (e.g., first surface 404S) and avoid dark current induced by surface damage. Each of the recessed regions 436 is in between adjacent metal structures 432 that is between the photodiode for infrared sensing. That is, each of the recessed regions 436 is formed in between metal structures disposed proximate to the photodiode for infrared sensing. As shown in FIG. 4F, the illustrated recessed regions 436 disposed over (e.g., above) photodiode 408d is in a space region between adjacent metal structures e.g., metal structures 432a and 432b. In some embodiments, mask for forming the recessed regions 430 may be patterned based on the locations of the metal structures 432. In one embodiment, the thickness 431T2 of buffer oxide layer 430 is about 500 nanometers, the depth RD is about 400 to 450 nanometers with respect to top surface 430T of buffer oxide layer 430 and the thickness 439T of thin region 439 is about 50 to 100 nanometers to provide processing protection for underlying material layers. It is appreciated that the depth RD of recessed regions 436 may be configured based on an amount of needed extended thickness for the infrared filter that achieve required infrared sensitivity. A width W1 of the recessed region 436 may be less than a width W3 of photodiode 408d and a width W2 defined by adjacent metal structures 432a and 432b along a horizontal direction parallel to first surface 404S (e.g., along direction 490X). Recessed region 436 is separated from metal structures 432. That is, the sidewalls of recessed region 436 are not in contact with adjacent metal structures 432. There exists a portion 437 of buffer oxide layer 430 between the recessed regions 436 and adjacent metal structures 432, which may provide material isolation between metal structures 432 and later-deposited color filter material.

Figure 4G:
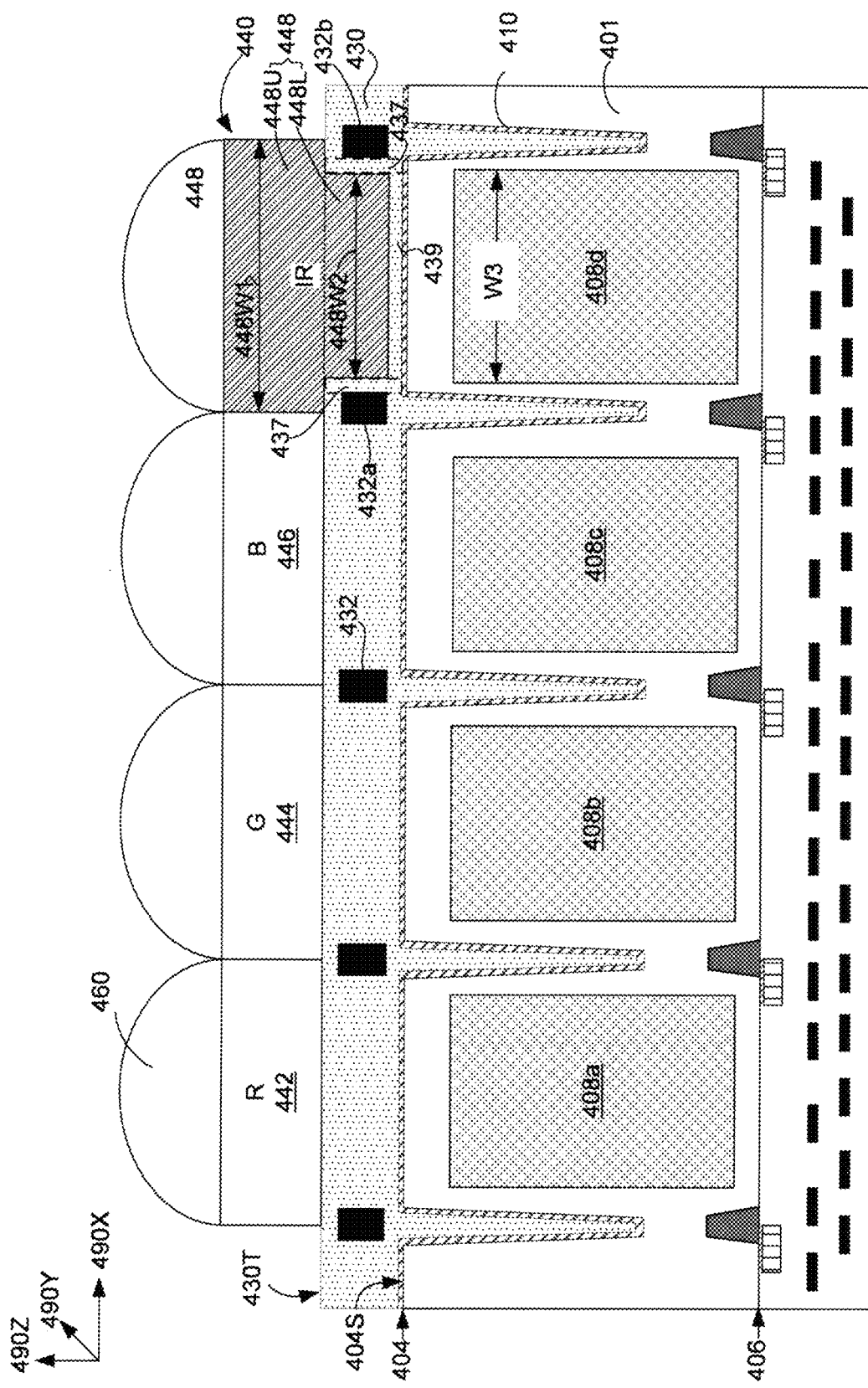

FIG. 4G is after FIG. 4F and shows deposition of color filter materials to form the color filter array 440 having a plurality of color filters on the buffer oxide layer 430, each aligned with respective photodiodes 408a-408d. The plurality of color filters at least includes a red color filter 442, a green color filter 444, a blue color filter 446, and an infrared filter 448. Each corresponding aperture defined by the plurality of metal structures 432 in buffer oxide layer 430 is between each of respective color filters in color filter array 440 and the corresponding photodiode 408a-408d. The red color filter 442 is formed on buffer oxide layer 430 aligned with corresponding photodiode 408a. The red color filter 442 and the underlying photodiode 408a form a red color pixel. The red color filter 442 may be formed of a red color filter material. In one example, the red color filter material is formed of a photo-resistive material or a resin material containing red color agent (such as red pigment or red dye) that transmits or passes red light (e.g., light having wavelength ranging from 600 nm to 650 nm) while reflecting and/or absorbing other colors of light. The green color filter 444 is formed on buffer oxide layer 430 aligned with corresponding photodiode 408b. The green color filter 444 and the underlying photodiode 408b form a green color pixel. The green color filter 444 may be formed of a green color filter material. In one example, the green color filter material is formed of a photo-resistive material or a resin material containing green color agent (such as green pigment or green dye) that transmits or passes green light (e.g., light having wavelength ranging from 500 nm to 550 nm) while reflecting and/or absorbing other colors of light. The blue color filter 446 is formed on buffer oxide layer 430 aligned with corresponding photodiode 408c. The blue color filter 446 and the underlying photodiode 408c form a blue color pixel. The blue color filter 446 may be formed of a blue color material. In one example, the blue color filter material is formed of a photo-resistive material or a resin material a material containing blue color agent (such as blue pigment or blue dye) that transmits or passes blue light (e.g., light having wavelength ranging from 400 nm to 450 nm) while reflecting and/or absorbing other colors of light. The infrared filter 448 is formed in the recessed region 436 on the thin region 439 and on buffer oxide layer 430, and the infrared filter 448 is aligned with corresponding photodiode 408d. The infrared filter 448 and the underlying photodiode 408d form an infrared pixel. The infrared filter 448 may be formed of a material composing of infrared filter material that transmits or passes infrared light (e.g., light having wavelength greater than 800 nm such as light having wavelength ranging between 800 nm to 3 μm) while reflecting and/or absorbing light in the visible light spectrum. The infrared filter 448 may comprise of a photo-resistive material or resin material.

Each of the color filters (eg., red color filter 442, a green color filter 444, a blue color filter 446, and an infrared filter 448) does not directly contact with metal structures 432 embedded in the buffer oxide layer 430. The infrared filter 448 is separated from adjacent metal structures 432 in the buffer oxide layer 430 by portion 437 of the buffer oxide layer 430. M ore specifically, the infrared filter 448 includes a first portion 448U of infrared filter 448 disposed on the top surface 430T of the buffer oxide layer 430 and a second portion 448L of infrared filter 448 disposed in the recessed region 436. The first portion 448U of infrared filter 448 has a first width 448W1 exceeding a second width 448W2 of the second portion 448L of infrared filter 448 disposed in the recessed region 436 along a horizontal direction parallel to first surface 404S (eg., along direction 490X). The second portion 448L of infrared filter 448 disposed in the recessed region 436 is in the space region between two proximate metal structures included in the plurality of metal structures 432 eg., between metal structures 432a, 432b. The first width 448W1 of the first portion 448U of infrared filter 448 on the top surface 430T of the buffer oxide layer 430 may be greater than width W2 defined by adjacent metal structures 432a and 432b along the horizontal direction parallel to first surface 404S (e.g., along direction 490X). The second width 448W2 of the second portion 448L of infrared filter 448 may be less than width W2 defined by adjacent metal structures 432a and 432b along the horizontal direction parallel to first surface 404S (eg., along direction 490X). The first width 448W1 of the first portion 448U of infrared filter 448 on the top surface 430T of the buffer oxide layer 430 may be greater than the width W3 of photodiode 408d along the horizontal direction parallel to first surface 404S (eg., along direction 490X) but the second width 448W2 of the second portion 448L of infrared filter 448 may be substantially equal or less than the width W3 of photodiode 408d.

The infrared filter 448 is separated from first side 404 surface at least by buffer oxide layer 430 and one or more layers 412. The first portion 448U of infrared filter 448 disposed on the top surface 430T of the buffer oxide layer 430 and the second portion 448L of infrared filter 448 disposed in the recessed region 436 have same material composition and are formed in the same deposition process. The infrared filter 448 may be entirely formed of same type of material, which can simplify color filter fabrication process and associated fabrication cost.

A microlens array may be formed on the color filter array 430 after FIG. 4G. The microlens array may include a plurality of microlenes 460, and each microlens is formed on respective color filters for directing light to the corresponding photodiodes (e.g., photodiodes 408a-408d).

It is appreciated that the various process steps illustrated by FIGS. 4A-4G may be accomplished or otherwise performed with existing CM OS manufacturing techniques such as, but not limited to photolithography techniques (e.g., to define or otherwise pattern with photoresist), material deposition techniques (eg., atomic layer deposition, physical vapor deposition, thermal evaporation, magnetron sputtering, or the like to deposit the one or more layers 412, the buffer oxide layer 430, the metal material 434, the additional oxide-based layer 435, the color filter materials, or the like), etching techniques (eg., dry etching techniques such as plasma etching, wet etching techniques such as chemical etching, or otherwise to etch various components such as the trenches 432R in the buffer layer oxide 430, the metal material 434 to form metal structures 432, the recessed region 436 in the buffer oxide layer 430, or the like), and planarization techniques (eg., chemical-mechanical polishing or planarization to planarize the buffer oxide layer 430 and/or metal material 434, the additional oxide-based material layer 435).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the disclosure is to be determined entirely by the following claims, which are to be construed in accordance with established doctrines of claim interpretation. Deviations from the particular embodiments shown will be apparent to those skilled in the art, particularly in view of the foregoing disclosure.

We claim:

1. An image sensor, comprising:
   a semiconductor substrate having a first surface and a second surface opposite to the first surface, the semiconductor substrate including a first photodiode and a second photodiode adjacent to the first photodiode;
   a planarized dielectric layer disposed on the first surface of the semiconductor substrate, the planarized dielectric layer having a recessed region;
   a first color filter disposed on the planarized dielectric layer between a first microlens and the first photodiode, and the first color filter configured to transmit a light of a first wavelength range; and
   a second color filter disposed in the recessed region and on the planarized dielectric layer, the second color filter being between a second microlens and the second photodiode, and the second color filter configured to transmit light of a second wavelength range;

wherein a first thickness of the first color filter is less than a second thickness of the second color filter along a first direction normal to the first surface.

2. The image sensor according to claim 1, wherein the first color filter is disposed on a top surface of the planarized dielectric layer, wherein the second color filter includes a first portion disposed on the top surface of the planarized dielectric layer and a second portion disposed in the recessed region.

3. The image sensor according to claim 2, wherein the first thickness of the first color filter and a first portion thickness of the first portion of the second color filter along the first direction are the same, wherein a second portion thickness of the second portion of the second color filter is less than a thickness of the planarized dielectric layer along the first direction.

4. The image sensor according to claim 2, wherein a width of the first portion of the second color filter exceeds a width of the second portion of the second color filter along a second direction perpendicular to the first direction.

5. The image sensor according to claim 4, wherein the width of the first portion of the second color filter is greater than a width of the second photodiode along the second direction.

6. The image sensor according to claim 2, wherein the planarized dielectric layer includes a plurality of metal structures at least including a first metal structure and a second metal structure, the first metal structure and the second metal structure defines a light receiving region aligning to the second photodiode, wherein the recessed region is between the first and second metal structures such that the second portion of the second color filter in the planarized dielectric layer is disposed in a space region between the first and second metal structures.

7. The image sensor according to claim 6, wherein a portion of the planarized dielectric layer separates and isolates the second portion of the second color filter from the first and second metal structures.

8. The image sensor according to claim 6, wherein the recessed region has a width less than a spacing between the first and second metal structures along a second direction perpendicular to the first direction.

9. The image sensor according to claim 6, further comprising an isolation structure disposed in the semiconductor substrate between the first and the second photodiodes, wherein the isolation structure is aligned with one of the metal structures.

10. The image sensor according to claim 6, wherein each of the first color filter and the second color filter is not in direct contact with the plurality of metal structures.

11. The image sensor according to claim 1, wherein the second color filter is entirely formed of a single type of optical filter material.

12. The image sensor according to claim 1, wherein the first wavelength range is between 400 nanometers and 650 nanometers, and the second wavelength range is between 800 nanometers and 3000 nanometers.

13. The image sensor according to claim 1, wherein the first color filter is a visible light color filter, and the second color filter is an infrared filter.

14. The image sensor according to claim 1, wherein the recessed region is spaced apart from the first surface of the semiconductor substrate by at least 500 angstroms.

* * * * *